(12) United States Patent
Joish

(10) Patent No.: US 10,340,966 B2
(45) Date of Patent: Jul. 2, 2019

(54) FAST TRANSIENT SETTLING IN A DIGITAL STEP ATTENUATOR

(71) Applicant: Texas Instruments Incorporated, Dallas, TX (US)

(72) Inventor: Rajendrakumar Joish, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/855,052

(22) Filed: Dec. 27, 2017

(65) Prior Publication Data

US 2018/0183475 A1  Jun. 28, 2018

(30) Foreign Application Priority Data

Dec. 27, 2016 (IN) .............................. 201641044434

(51) Int. Cl.
*H04B 1/16* (2006.01)
*H03M 1/12* (2006.01)
*H03M 1/18* (2006.01)

(52) U.S. Cl.
CPC .............. *H04B 1/16* (2013.01); *H03M 1/124* (2013.01); *H03M 1/183* (2013.01)

(58) Field of Classification Search
CPC .......... H04B 1/16; H03M 1/124; H03M 1/183
See application file for complete search history.

(56) References Cited

U.S. PATENT DOCUMENTS

| | | | | |
|---|---|---|---|---|
| 4,381,485 A * | 4/1983 | Steinbrecher | ...... | G01R 31/2822 324/636 |
| 5,001,480 A * | 3/1991 | Ferry | ........................ | G06J 1/00 341/108 |
| 10,145,872 B2 * | 12/2018 | Crooks | .................. | G01R 23/16 |
| 2016/0079959 A1 * | 3/2016 | Joish | ........................ | H03H 7/25 327/308 |
| 2016/0099743 A1 * | 4/2016 | Kolcuoglu | ............... | H04B 1/48 455/78 |
| 2016/0241216 A1 * | 8/2016 | Bawell | ...................... | H01P 1/22 |
| 2016/0285447 A1 * | 9/2016 | Krishnannurthi | .... | H03K 17/165 |

* cited by examiner

*Primary Examiner* — Freshteh N Aghdam
(74) *Attorney, Agent, or Firm* — John R. Pessetto; Charles A. Brill; Frank D. Cimino

(57) ABSTRACT

The disclosure provides an RF receiver. The RF receiver includes an input driver. The input driver receives a coarse signal, and generates an input signal. A digital step attenuator (DSA) is coupled to the input driver and receives the input signal. An analog to digital converter (ADC) is coupled to the DSA. The DSA includes a sampling capacitor coupled to the ADC. The DSA also includes a time dependent resistor coupled to a source voltage and to the sampling capacitor.

20 Claims, 3 Drawing Sheets

FAST TRANSIENT SETTLING IN A DIGITAL STEP ATTENUATOR

CROSS REFERENCES TO RELATED APPLICATIONS

This application claims priority from India provisional patent application No. 201641044434 filed on Dec. 27, 2016 which is hereby incorporated by reference in its entirety.

TECHNICAL FIELD

The present disclosure is generally related to an RF (radio frequency) receiver and more particularly to a digital step attenuator used in the RF receiver.

BACKGROUND

Recent advancements in wireless communications require an RF receiver that can support a wide dynamic range of analog input signals. A digital step attenuator (DSA) is widely used in the RF receivers with wideband and multi-band applications. The DSA is an analog attenuator whose attenuation is controlled digitally. The DSA can be integrated with the RF receiver or it can be external to the RF receiver. However, it is preferred to integrate the DSA in the RF receiver since it reduces the overall board area and also the cost.

Due to high dynamic range of analog input signals received by the RF receiver, the DSA is required to support a large range of attenuations. This ensures that a voltage level reaching the other components of the RF receiver post DSA is within a defined limit, so as to ensure normal operation of the RF receiver. Thus, DSA is important for ensuring reliability of the components used in the RF receiver. An effective resistance at an output of the DSA should be large to get a good noise figure. One major drawback of having large effective resistance is the slow transient settling that occurs whenever an attenuation of the DSA is modified.

SUMMARY

According to an aspect of the disclosure, an RF receiver is disclosed. The RF receiver includes an input driver. The input driver receives a coarse signal, and generates an input signal. A digital step attenuator (DSA) is coupled to the input driver and receives the input signal. An analog to digital converter (ADC) is coupled to the DSA. The DSA includes a sampling capacitor coupled to the ADC. The DSA also includes a time dependent resistor coupled to a source voltage and to the sampling capacitor.

BRIEF DESCRIPTION OF THE VIEWS OF DRAWINGS

Figure 6:
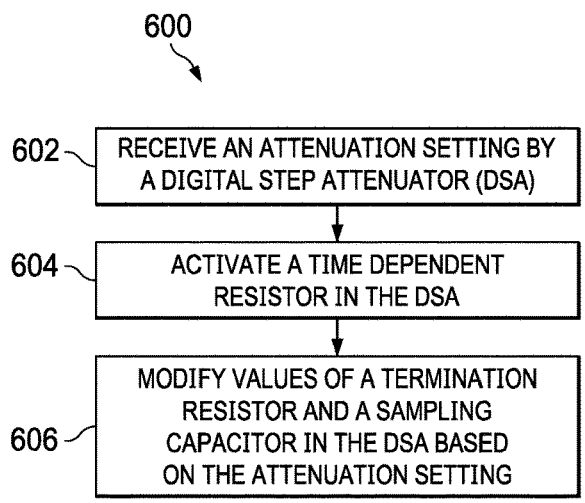
Figure 7:
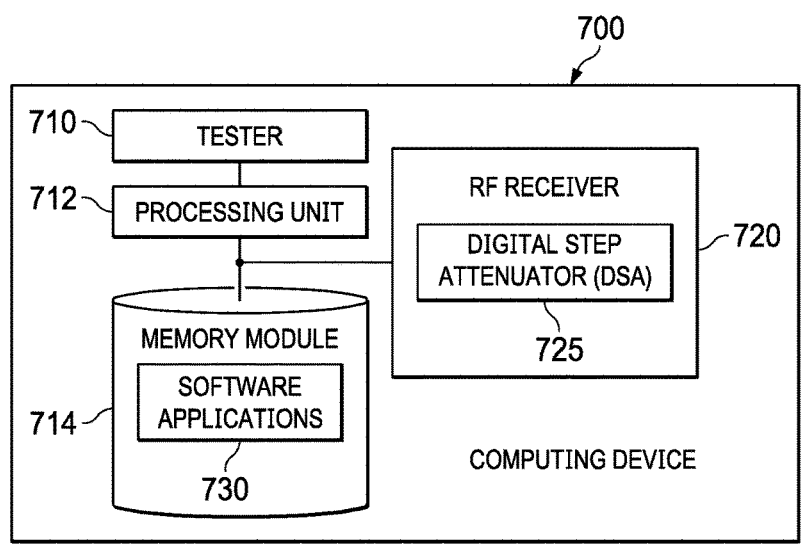
Figure 5:
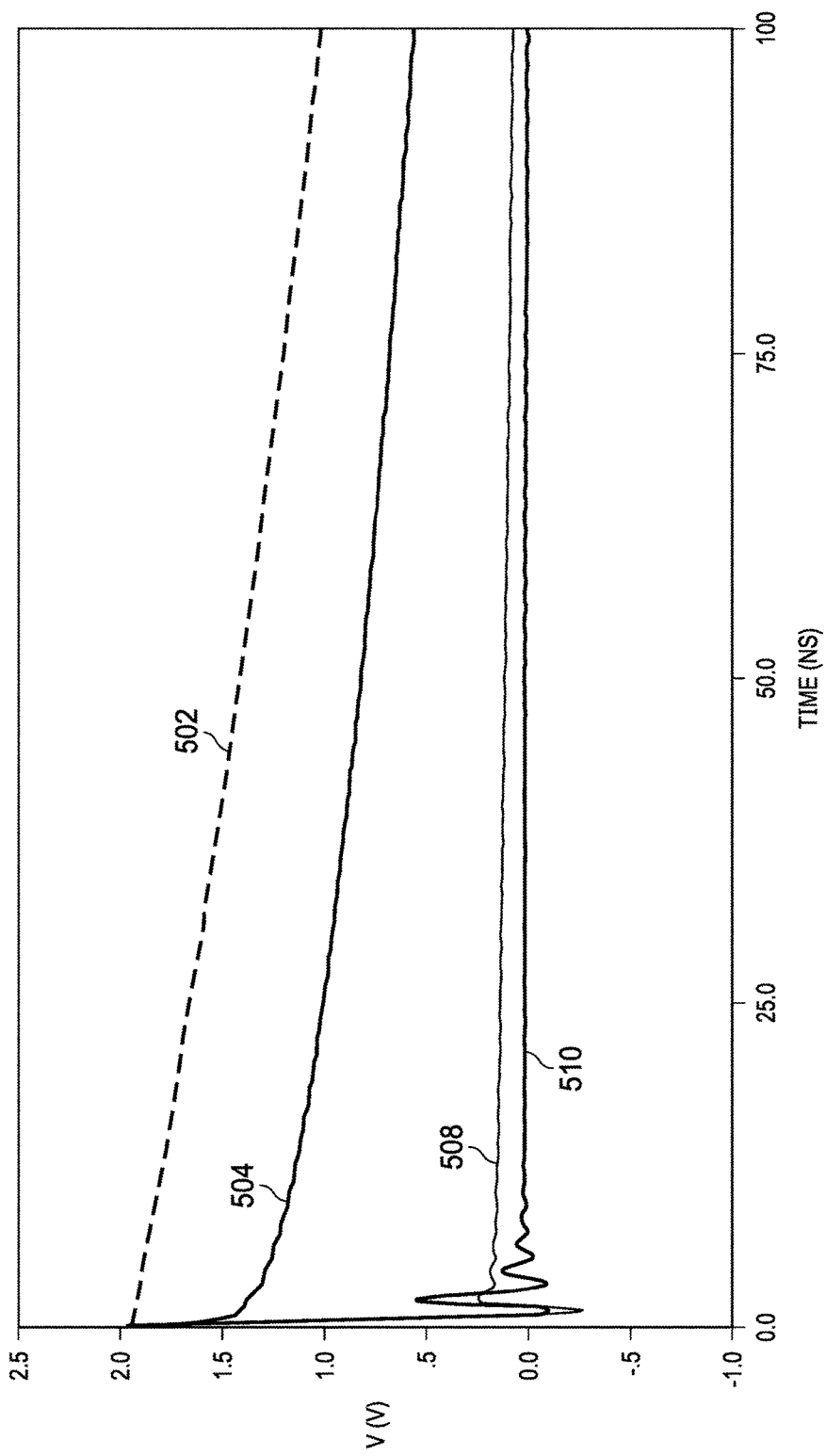

FIG. 5 graphically illustrates settling of an abrupt charge generated in a digital step attenuator (DSA), according to an embodiment;

FIG. 6 is a flowchart to illustrate a method of operation of a digital step attenuator, according to an embodiment; and FIG. 7 illustrates a computing device, according to an embodiment.

DETAILED DESCRIPTION OF THE EMBODIMENTS

Figure 1:
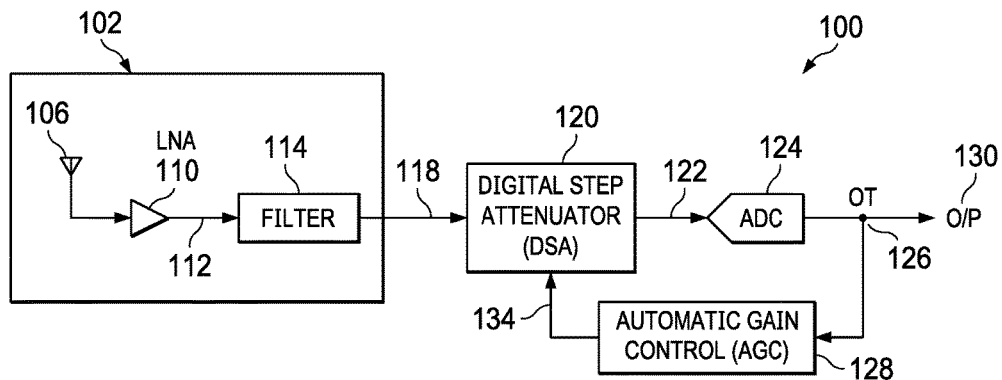
FIG. 1 is a block diagram illustrating an example radio frequency (RF) receiver in which several aspects of the present invention can be implemented.

FIG. 1 is a block diagram illustrating an example radio frequency (RF) receiver 100 in which several aspects of the present invention can be implemented. The RF receiver 100 includes an input driver 102, a digital step attenuator (DSA) 120, an analog to digital converter (ADC) 124 and an automatic gain control (AGC) block 128. The input driver 102 includes an antenna 106, a low noise amplifier (LNA) 110 and a filter 114. The LNA 110 is coupled to the antenna 106, and the filter 114 is coupled to the LNA 110.

The DSA 120 is coupled to the input driver 102, and the ADC 124 is coupled to the DSA 120. In one example, a gain stage block is coupled between the DSA 120 and the ADC 124. The AGC block 128 is coupled to the ADC 124 and the DSA 120. The RF receiver 100 may include one or more additional components known to those skilled in the relevant art and are not discussed here for simplicity of the description.

The antenna 106 in the input driver 102 receives a coarse signal. The LNA 110 amplifies the coarse signal to generate an amplified signal 112. The filter 114 receives the amplified signal 112, and filters the amplified signal 112 to generate an input signal 118. The DSA 120 is coupled to the filter 114, and receives the input signal 118. The DSA 120 attenuates the input signal 118 to generate an attenuated signal 122. The ADC 124 receives the attenuated signal 122, and generates an output signal O/P 130 at an output terminal OT 126.

The AGC block 128 is coupled to the output terminal OT 126, and receives the output signal O/P 130 as a feedback. The AGC block 128 generates a program signal 134 which is provided to the DSA 120. The program signal 134 includes an attenuation setting. The DSA 120 attenuates the input signal 118 based on the attenuation setting received from the AGC block 128. In one version, the DSA 120 receives the attenuation setting from a serial peripheral interface (SPI) or by any other means known in the art.

Figure 2:
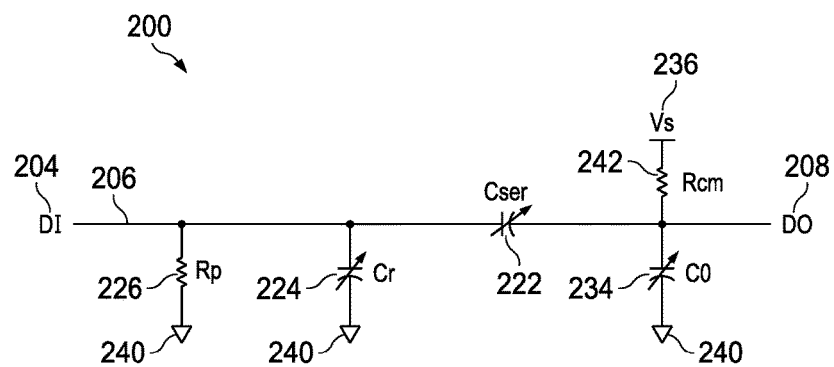
FIG. 2 illustrates a digital step attenuator (DSA)

FIG. 2 illustrates a digital step attenuator (DSA) 200. The DSA 200, in one example, is part of the radio frequency (RF) receiver 100, and is very similar in connection to the DSA 120. The DSA 200 includes a DSA input terminal DI 204 and a DSA output terminal DO 208. The DSA input terminal DI 204 is coupled to an input driver. The input driver is analogous, in connection and operation, to the input driver 102 illustrated in FIG. 1. The DSA input terminal DI 204, in one example, is coupled to the filter, for example filter 114, in the input driver 102. The DSA output terminal DO 208 is coupled to an analog to digital converter (ADC). The ADC is analogous, in connection and operation, to the ADC 124 illustrated in FIG. 1.

The DSA 200 includes a termination resistor Rp 226. The termination resistor Rp 226 is coupled between the DSA input terminal DI 204 and a fixed voltage terminal 240. The DSA 200 also includes a residual capacitor Cr 224, a serial capacitor Cser 222, a sampling capacitor C0 234 and a common mode resistor Rcm 240. The residual capacitor Cr 224 is coupled between the DSA input terminal DI 204 and the fixed voltage terminal 240.

The serial capacitor Cser 222 is coupled between the DSA input terminal DI 204 and the DSA output terminal DO 208. The sampling capacitor C0 234 is coupled to the serial capacitor Cser 222, the DSA output terminal DO 208 and the fixed voltage terminal 240. The sampling capacitor C0 234 is coupled an ADC, for example the ADC 124 illustrated in FIG. 1, through the DSA output terminal DO 208. The common mode resistor Rcm 242 is coupled between a source voltage Vs 236 and the DSA output terminal DO 208. The common mode resistor Rcm 242 is also coupled to the serial capacitor Cser 222 and the sampling capacitor C0 234.

The operation of the DSA 200 is explained in connection with the RF receiver 100, illustrated in FIG. 1. The DSA 200 receives an input signal 206 at the DSA input terminal DI 204. The input signal 206 is received from the input driver, for example the input driver 102 illustrated in FIG. 1

The DSA 200 is responsible for attenuating the input signal 206 by use of the serial capacitor Cser 222, the residual capacitor Cr 224 and the sampling capacitor C0 234 which acts as a switched capacitor network. These capacitors are charged by the input signal 206. A charge accumulated on the sampling capacitor C0 234 is provided to the ADC, for example, the ADC 124 illustrated in FIG. 1.

The ADC 124 generates an output signal based on the charge accumulated on the sampling capacitor C0 234. The AGC block 128 generates a program signal based on the output signal generated by the ADC 124. The program signal includes an attenuation setting which is provided to the DSA 200. The attenuation setting is used to refine or fix values of the termination resistor Rp 226, the serial capacitor Cser 222 and the sampling capacitor C0 234.

The DSA 200 suffers from multiple disadvantages. An effective capacitance for the DSA 200 at the DSA output terminal DO 208 is measured as:

$$Ceff = C0 + Cser \quad (1)$$

In the above equation, it is assumed that a parallel addition of Rs and the termination resistor Rp 226 is small. Rs is a resistance offered by the input driver at the DSA input terminal DI 204. Since, a parallel addition of Rs and the termination resistor Rp 226 is less than a value of the common mode resistor Rcm 242, an effective resistance of the DSA 200, at the DSA output terminal DO 208, is proportional to the common mode resistor Rcm 242.

An effective decay time constant at the DSA output terminal DO 208 is given by $\tau_{eff} = Ceff \times Rcm$. This determines a lowest frequency of the input signal 206 that can reliably pass from the DSA input terminal DI 204 to the DSA output terminal DO 208. It is also referred as 3 dB frequency corner. In order to minimize this frequency corner, the common mode resistor Rcm 242 need to be very large as compared to the termination resistor Rp 226 and Rs, and also it should not interfere with DSA 200 operation in bands of interest.

In steady state, a total charge on the DSA output terminal DO 208 is zero as any non zero average charge would eventually be discharged by the common mode resistor Rcm 242 to Vs 236. The serial capacitor Cser 222, the residual capacitor Cr 224 and the sampling capacitor C0 234 are built using arrays of switches and capacitors. The termination resistor Rp 226 is built using arrays of switches and resistors. Whenever, a new attenuation setting is received from the AGC block 128, based on the required values of the serial capacitor Cser 222, the residual capacitor Cr 224, the sampling capacitor C0 234 and the termination resistor Rp 226, corresponding switches in the respective arrays are turned ON or OFF. This results in capacitor reshuffling.

Just before receiving the new attenuation settings, all the components carried an effective non zero charge. After receiving the new attenuation settings, an abrupt charge builds up the DSA output terminal DO 208. This is eventually discharged through the common mode resistor Rcm 242 but at a new time constant because of a new effective capacitance (due to variation in values of capacitors in the DSA 200). The new effective capacitance is also large due to the 3 dB frequency corner requirement.

This new time constant can be of the order of 150-200 ns based on the 3 dB frequency corner requirement. Therefore, the abrupt charge decays slowly because of this new time constant. This abrupt charge results in erroneous values of the output signal generated by the ADC 124. This makes the DSA 200 unfit for RF receivers with wideband and multi-band applications.

Figure 3:
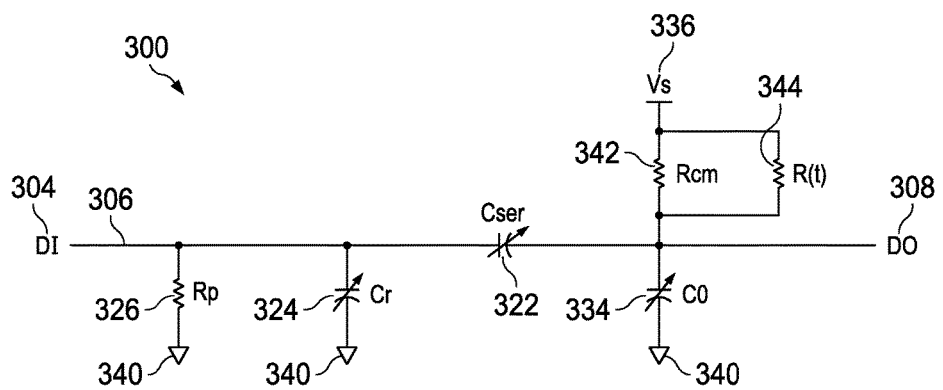
FIG. 3 illustrates a digital step attenuator (DSA), according to an embodiment.

FIG. 3 illustrates a digital step attenuator (DSA) 300, according to an embodiment. The DSA 300, in one example, is part of the radio frequency (RF) receiver 100, and is very similar in connection to the DSA 120. The DSA 300 includes a DSA input terminal DI 304 and a DSA output terminal DO 308. The DSA input terminal DI 304 is coupled to an input driver. The input driver is analogous, in connection and operation, to the input driver 102 illustrated in FIG. 1. The DSA input terminal DI 304, in one example, is coupled to the filter, for example filter 114, in the input driver 102. The DSA output terminal DO 308 is coupled to an analog to digital converter (ADC). The ADC is analogous, in connection and operation, to the ADC 134 illustrated in FIG. 1.

The DSA 300 includes a termination resistor Rp 326. The termination resistor Rp 326 is coupled between the DSA input terminal DI 304 and a fixed voltage terminal 340. The DSA 300 also includes a residual capacitor Cr 334, a serial capacitor Cser 322, a sampling capacitor C0 334, a common mode resistor Rcm 340 and a time dependent resistor R(t) 344. The residual capacitor Cr 334 is coupled between the DSA input terminal DI 304 and the fixed voltage terminal 340.

The serial capacitor Cser 322 is coupled between the DSA input terminal DI 304 and the DSA output terminal DO 308. The sampling capacitor C0 334 is coupled to the serial capacitor Cser 322, the DSA output terminal DO 308 and the fixed voltage terminal 340. The sampling capacitor C0 334 is coupled an ADC, for example the ADC 124 illustrated in FIG. 1, through the DSA output terminal DO 308. The time dependent resistor R(t) 344 is coupled to a source voltage Vs 336 and the sampling capacitor C0 334. The common mode resistor Rcm 342 is coupled in parallel to the time dependent resistor R(t) 344. The common mode resistor Rcm 342 is coupled between the source voltage Vs 336 and the DSA output terminal DO 308. The time dependent resistor R(t) 344 and the common mode resistor Rcm 342 are also coupled to the serial capacitor Cser 322 and the sampling capacitor C0 334. The DSA 300 may include one or more additional components known to those skilled in the relevant art and are not discussed here for simplicity of the description.

The operation of the DSA 300 is explained in connection with the RF receiver 100, illustrated in FIG. 1. The DSA 300 receives an input signal 306 at the DSA input terminal DI 304. The input signal 306 is received from the input driver, for example the input driver 102 illustrated in FIG. 1

The DSA 300 is responsible for attenuating the input signal 306 by use of the serial capacitor Cser 322, the residual capacitor Cr 334 and the sampling capacitor C0 334 which acts as a switched capacitor network. These capacitors are charged by the input signal 306. A charge accumulated on the sampling capacitor C0 334 is provided to the ADC, for example, the ADC 124 illustrated in FIG. 1.

The DSA 300, as illustrated, is a continuous time capacitive attenuator. In one version, the DSA 300 is a discrete time capacitive attenuator. The discrete time capacitive attenuator includes a sampling switch coupled between the serial capacitor Cser 322 and the DSA output terminal DO 308. The discrete time capacitive attenuator operates in a sample phase and a hold phase.

In the sample phase, the sampling switch is closed. The serial capacitor Cser 322 and the sampling capacitor C0 334 are in series and are charged by the input signal 306. During the hold phase, the sampling switch is opened. A charge accumulated on the sampling capacitor C0 334 is provided to the ADC, for example the ADC 124 illustrated in FIG. 1.

The ADC 124 generates an output signal based on the charge accumulated on the sampling capacitor C0 334. The AGC block 128 generates a program signal based on the output signal generated by the ADC 124. The program signal includes an attenuation setting which is provided to the DSA 300. The attenuation setting is used to refine or fix values of the termination resistor Rp 326, the serial capacitor Cser 322 and the sampling capacitor C0 334.

The time dependent resistor R(t) 344 is activated on receiving the attenuation setting. In one version, the reception of the attenuation setting and activation of the time dependent resistor R(t) 344 is simultaneous. A resistance of the time dependent resistor R(t) 344, in one example, varies with time. In another example, the resistance of the time dependent resistor R(t) 344 varies linearly with time. In yet another example, the resistance of the time dependent resistor R(t) 344 varies exponentially with time. At initialization, the resistance of the time dependent resistor R(t) 344 is less as compared to the resistance in steady state.

An effective capacitance for the DSA 300 at the DSA output terminal DO 308 is measured as:

$$Ceff = C0 + Cser \quad (3)$$

In the above equation, it is assumed that a parallel addition of Rs and the termination resistor Rp 326 is small. Rs is a resistance offered by the input driver at the DSA input terminal DI 304.

At time t, an effective resistance Reff of the DSA 300 is proportional to a parallel addition of the common mode resistor Rcm 342 and the time dependent resistor R(t) 344. The time dependence of the time dependent resistor R(t) 344 can be implemented using an analog circuit or a digital control.

In steady state, a total charge on the DSA output terminal DO 308 is zero as any non zero average charge would eventually be discharged by the common mode resistor Rcm 342 to Vs 336. The serial capacitor Cser 322, the residual capacitor Cr 324 and the sampling capacitor C0 334 are built using arrays of switches and capacitors. The termination resistor Rp 326 is built using arrays of switches and resistors. Whenever, a new attenuation setting is received from the AGC block 128, based on the required values of the serial capacitor Cser 322, the residual capacitor Cr 324, the sampling capacitor C0 334 and the termination resistor Rp 326, corresponding switches in the respective arrays are turned ON or OFF. This results in capacitor reshuffling.

Just before receiving the new attenuation settings, all the components carried an effective non zero charge. After receiving the new attenuation settings, an abrupt charge builds up the DSA output terminal DO 308. This is eventually discharged through the common mode resistor Rcm 342 but at a much faster rate as compared to the DSA 200. This is because the effective resistance Reff is much smaller than the common mode resistor Rcm 342, and is defined as:

$$\frac{1}{Reff} = \frac{1}{Rcm} + \frac{1}{R(t)} \quad (4)$$

Since, the effective resistance Reff is proportional to a parallel addition of the common mode resistor Rcm 342 and the time dependent resistor R(t) 344, it results in faster discharge of this abrupt charge. The time dependent resistor R(t) 344 plays an important role in the discharge of the abrupt charge. On receiving the attenuation setting by the DSA 300, the abrupt charge is developed at the DSA output terminal DO 308. At this point, the time dependent resistor R(t) 344 (since R(t) is much smaller in value as compared to Rcm) is primarily used for discharging this abrupt charge. As time passes, when a value of the time dependent resistor R(t) 344 is greater than the common mode resistor Rcm 342, a settling time of this abrupt charge is dependent on the common mode resistor Rcm 342.

Thus, the time dependent resistor R(t) 344 results in faster transient settling of abrupt charge at the DSA output terminal DO 308. Thus, the DSA 300 finds application in RF receivers with wideband and multiband applications.

Figure 4:
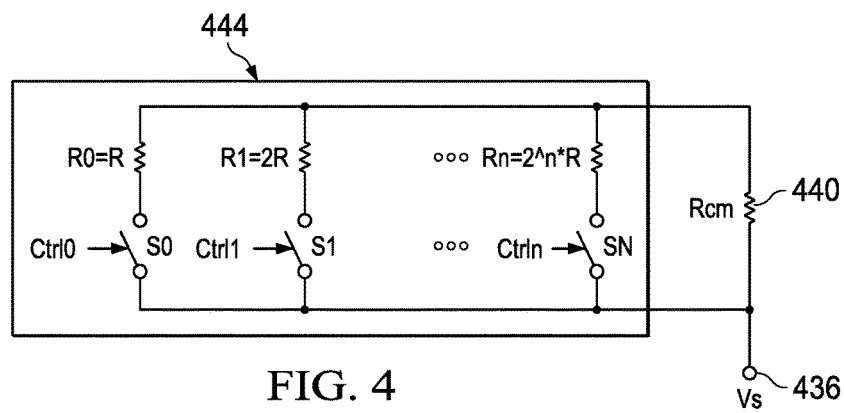
FIG. 4 illustrates a time dependent resistor, according to an embodiment.

FIG. 4 illustrates a time dependent resistor R(t) 444, according to an embodiment. The time dependent resistor R(t) 444 is one of the many ways of implementing the time dependent resistor R(t) 344 illustrated in FIG. 3, and variations, and alternative constructions are apparent and well within the spirit and scope of the disclosure. The time dependent resistor R(t) 444 includes one or more secondary resistors 446 illustrated as R0, R1 to Rn. The one or more secondary resistors 446 are coupled in parallel and also coupled to a DSA output terminal, for example the DSA output terminal 308 illustrated in FIG. 3.

The time dependent resistor R(t) 444 includes one or more secondary switches 450 coupled to the one or more secondary resistors 446. The one or more secondary resistors 446 are represented as S0, S1 to Sn. These switches are controlled by control signals illustrated as Ctrl0, Ctrl1 to Ctrln. Each secondary switch is coupled between a secondary voltage Vs 436 and a secondary resistor of the one or more secondary resistors 446. For example, the secondary switch S0 is coupled between the secondary voltage Vs 436 and the secondary resistor R0.

The time dependent resistor R(t) 444 is coupled in parallel to a common mode resistor Rcm 440. The common mode resistor Rcm 440 is similar in connection and operation to the common mode resistor Rcm 342. The common mode resistor Rcm 440 is coupled between the source voltage Vs 436 and the DSA output terminal, for example the DSA output terminal DO 308. The time dependent resistor R(t) 444 and the common mode resistor Rcm 440 are also coupled to a serial capacitor and a sampling capacitor. The time dependent resistor R(t) 444 may include one or more additional components known to those skilled in the relevant art and are not discussed here for simplicity of the description.

The one or more secondary switches 450 are activated as a function of time. For example, at time t less than zero i.e. before any attenuation setting is received, all the secondary switches are open. At initialization, at time t equal to zero i.e. on receiving the attenuation setting by the DSA 300, all the secondary switches are closed. This provides least possible resistance value. At time t1, the secondary switch S0 is opened, thus disconnecting the secondary resistor R0, and hence increasing resistance value. Hence, the resistance value increases discretely with time. The one or more secondary switches 450 can be controlled digitally or by an analog circuit using the control signals Ctrl0, Ctrl1 to Ctrln.

FIG. 5 graphically illustrates settling of an abrupt charge generated in a digital step attenuator (DSA), according to an embodiment. The figure illustrates settling of the abrupt charge generated at a DSA output terminal as a function of time. Graph 502 illustrates settling of the abrupt charge generated at the DSA output terminal DO 208 in the DSA 200. As illustrated, the abrupt charge takes a very long time to settle. This is because of the high time constant as a result of the common mode resistor Rcm 242.

Graphs 504, 506 and 508 illustrate settling of the abrupt charge generated at the DSA output terminal DO 308 in the DSA 300. Graph 504 illustrate settling of abrupt charge when a resistance of the time dependent resistor R(t) 344 is a linear function of time. Graph 508 illustrate settling of abrupt charge when a resistance of the time dependent resistor R(t) 344 is a quadratic function of time. Graph 510 illustrate settling of abrupt charge when a resistance of the time dependent resistor R(t) 344 is an exponential function of time. Among these three graphs, the abrupt charge settles fastest when a resistance of the time dependent resistor R(t) is an exponential function of time.

Thus, when the time dependent resistor R(t) 344 is used in the DSA 300, and a resistance of the time dependent resistor R(t) 344 is an exponential function of time, it results in fast settling of abrupt charge as compared to DSA 200.

FIG. 6 is a flowchart 600 to illustrate a method of operation of a digital step attenuator, according to an embodiment. The flowchart 600 is explained in connection with the digital step attenuator (DSA) 300 illustrated in FIG. 3. At step 602, an attenuation setting is received by the DSA. For example, in the DSA 300, the ADC 124 generates an output signal based on the charge accumulated on the sampling capacitor C0 334. The AGC block 128 generates a program signal based on the output signal generated by the ADC 124. The program signal includes an attenuation setting which is provided to the DSA 300.

At step 604, a time dependent resistor in the DSA is activated. In DSA 300, the time dependent resistor R(t) 344 is activated on receiving the attenuation setting. A resistance of the time dependent resistor R(t) 344, in one example, varies with time. In another example, the resistance of the time dependent resistor R(t) 344 varies linearly with time. In yet another example, the resistance of the time dependent resistor R(t) 344 varies exponentially with time. At initialization, the resistance of the time dependent resistor R(t) 344 is less as compared to the resistance in steady state.

At step 606, values of a termination resistor and a sampling capacitor in the DSA are modified based on the attenuation setting. In the DSA 300, the attenuation setting is used to refine or fix values of the termination resistor Rp 326, the serial capacitor Cser 322 and the sampling capacitor C0 334. The DSA 300 is responsible for attenuating the input signal 306 by use of the serial capacitor Cser 322, the residual capacitor Cr 334 and the sampling capacitor C0 334 which acts as a switched capacitor network. These capacitors are charged by the input signal 306. A charge accumulated on the sampling capacitor C0 334 is provided to the ADC, for example, the ADC 124 illustrated in FIG. 1.

A DSA using the method illustrated by flowchart 600 will allow for fast discharging of abrupt charge generated at the DSA output terminal because of the received attenuation settings. The time dependent resistor plays an important role in the discharge of the abrupt charge. On receiving the attenuation setting by the DSA, the abrupt charge is developed at the DSA output terminal. At this point, the time dependent resistor is primarily used for discharging this abrupt charge. As time passes, when a value of the time dependent resistor is greater than the common mode resistor, a settling time of this abrupt charge is dependent on the common mode resistor.

Thus, the time dependent resistor results in faster transient settling of abrupt charge at the DSA output terminal. Thus, the DSA using the method illustrated by flowchart 600 finds application in RF receivers with wideband and multiband applications.

FIG. 7 illustrates a computing device 700, according to an embodiment. The computing device 700 is, or is incorporated into, a mobile communication device, such as a mobile phone, a personal digital assistant, a transceiver, a personal computer, or any other type of electronic system. The computing device 700 may include one or more additional components known to those skilled in the relevant art and are not discussed here for simplicity of the description.

In some embodiments, the computing device 700 comprises a megacell or a system-on-chip (SoC) which includes a processing unit 712 such as a CPU (Central Processing Unit), a memory module 714 (e.g., random access memory (RAM)) and a tester 710. The processing unit 712 can be, for example, a CISC-type (Complex Instruction Set Computer) CPU, RISC-type CPU (Reduced Instruction Set Computer), or a digital signal processor (DSP).

The memory module 714 (which can be memory such as RAM, flash memory, or disk storage) stores one or more software applications 730 (e.g., embedded applications) that, when executed by the processing unit 712, performs any suitable function associated with the computing device 700. The tester 710 comprises logic that supports testing and debugging of the computing device 700 executing the software applications 730.

For example, the tester 710 can be used to emulate a defective or unavailable component(s) of the computing device 700 to allow verification of how the component(s), were it actually present on the computing device 700, would perform in various situations (e.g., how the component(s) would interact with the software applications 730). In this way, the software applications 730 can be debugged in an environment which resembles post-production operation.

The processing unit 712 typically comprises memory and logic which store information frequently accessed from the memory module 714. The computing device 700 includes an RF receiver 720. The RF receiver 720 is coupled to the processing unit 712 and the memory module 714. The RF receiver 720 includes a digital step attenuator (DSA) 725. The DSA 725 is similar in connection and operation to the DSA 300 illustrated in FIG. 3. The DSA 725 includes a DSA input terminal DI and a DSA output terminal DO. The DSA input terminal DI is coupled to an input driver. The input driver is analogous, in connection and operation, to the input driver 102 illustrated in FIG. 1. The DSA input terminal DI is coupled to a filter in the input driver, for example the filter 114 illustrated in FIG. 1. The DSA output terminal DO is coupled to an analog to digital converter (ADC). The ADC is analogous, in connection and operation, to the ADC 124 illustrated in FIG. 1.

The DSA 725 includes a termination resistor, a residual capacitor, a serial capacitor, a sampling capacitor, a common mode resistor and a time dependent resistor. The sampling capacitor is coupled to the serial capacitor, the DSA output terminal and the fixed voltage terminal. The sampling capacitor is coupled an ADC, for example the ADC 124 illustrated in FIG. 1, through the DSA output terminal. The time dependent resistor is coupled to a source voltage and the sampling capacitor.

The DSA 725 is responsible for attenuating the input signal by use of the serial capacitor, the residual capacitor and the sampling capacitor which acts as a switched capacitor network. These capacitors are charged by the input signal 306. A charge accumulated on the sampling capacitor is provided to the ADC, for example, the ADC 124 illustrated in FIG. 1.

The ADC 124 generates an output signal based on the charge accumulated on the sampling capacitor. The AGC block 128 generates a program signal based on the output signal generated by the ADC 124. The program signal includes an attenuation setting which is provided to the DSA 725. The attenuation setting is used to refine or fix values of the termination resistor, the serial capacitor and the sampling capacitor.

The time dependent resistor is activated on receiving the attenuation setting. A resistance of the time dependent resistor, in one example, varies with time. In another example, the resistance of the time dependent resistor R(t) 344 varies linearly with time. In yet another example, the resistance of the time dependent resistor R(t) 344 varies exponentially with time. At initialization, the resistance of the time dependent resistor R(t) 344 is less as compared to the resistance in steady state.

The DSA 725 will allow for fast discharging of abrupt charge generated at the DSA output terminal because of the received attenuation settings. The time dependent resistor plays an important role in the discharge of the abrupt charge. On receiving the attenuation setting by the DSA, the abrupt charge is developed at the DSA output terminal. At this point, the time dependent resistor is primarily used for discharging this abrupt charge. As time passes, when a value of the time dependent resistor is greater than the common mode resistor, a settling time of this abrupt charge is dependent on the common mode resistor.

Thus, the time dependent resistor results in faster transient settling of abrupt charge at the DSA output terminal. Thus, the RF receiver 620 can be used for wideband and multiband applications.

Modifications are possible in the described embodiments, and other embodiments are possible, within the scope of the claims.

What is claimed is:

1. An RF receiver comprising
an input driver configured to receive a coarse signal, and configured to generate an input signal;
a digital step attenuator (DSA) coupled to the input driver and configured to receive the input signal; and
an analog to digital converter (ADC) coupled to the DSA, wherein the DSA further comprises:
a sampling capacitor coupled to the ADC; and
a time dependent resistor coupled to a source voltage and to the sampling capacitor.

2. The RF receiver of claim 1, wherein a resistance of the time dependent resistor varies with time.

3. The RF receiver of claim 1, wherein a resistance of the time dependent resistor is an exponential function of time.

4. The RF receiver of claim 1, wherein the time dependent resistor comprises:
one or more secondary resistors coupled in parallel and coupled to a DSA output terminal;
one or more secondary switches coupled to the one or more secondary resistors, each secondary switch is coupled between the source voltage and a secondary resistor on the one or more secondary resistors.

5. The RF receiver of claim 1, wherein the input driver further comprises:
an antenna configured to receive the coarse signal;
a low noise amplifier (LNA) coupled to the antenna and configured to amplify the coarse signal to generate an amplified signal; and
a filter coupled to the LNA and configured to filter the amplified signal to generate the input signal.

6. The RF receiver of claim 4, wherein the DSA further comprises:
a termination resistor coupled between the DSA input terminal and a fixed voltage terminal, the DSA input terminal is coupled to the filter in the input driver; and
a serial capacitor coupled between the DSA input terminal and a DSA output terminal; wherein the sampling capacitor is coupled to the serial capacitor, the DSA output terminal and the fixed voltage terminal.

7. The RF receiver of claim 5, wherein the DSA further comprises a common mode resistor coupled in parallel to the time dependent resistor, the common mode resistor is coupled to the source voltage and the DSA output terminal.

8. The RF receiver of claim 4, wherein the DSA further comprises a residual capacitor coupled between the DSA input terminal and the fixed voltage terminal.

9. The RF receiver of claim 4, wherein the ADC is coupled to the DSA output terminal and is configured to generate an output signal at an ADC output terminal.

10. The RF receiver of claim 8 further comprising an automatic gain control (AGC) block coupled to the ADC output terminal and the DSA, the AGC block configured to receive the output signal as a feedback and configured to generate a program signal, the program signal is provided to the DSA.

11. A method comprising:
receiving an attenuation setting by a digital step attenuator (DSA);
activating a time dependent resistor in the DSA; and
modifying values of a termination resistor and a sampling capacitor in the DSA based on the attenuation setting.

12. The method of claim 11, wherein activating the time dependent resistor further comprises varying a resistance of the time dependent resistor with time.

13. The method of claim 11, wherein activating the time dependent resistor further comprises varying a resistance of the time dependent resistor exponentially with time.

14. The method of claim 11 further comprising providing an input signal to the DSA, the input signal is provided by an input driver coupled to the DSA.

15. The method of claim 11 further comprising:
providing a charge accumulated on the sampling capacitor to an analog to digital converter (ADC), the ADC is coupled to the DSA;
generating an output signal by the ADC based on the charge accumulated on the sampling capacitor;
providing the output signal as a feedback to an automatic gain control (AGC) block, the AGC block is coupled between the ADC and the DSA; and
generating a program signal based on the output signal, the program signal includes the attenuation setting.

16. The method of claim 11, wherein the time dependent resistor comprises:
one or more secondary resistors coupled in parallel and coupled to the sampling capacitor; and
one or more secondary switches coupled to the one or more secondary resistors, each secondary switch is coupled between a source voltage and a secondary resistor on the one or more secondary resistors.

17. A computing device comprising:
a processing unit;
a memory module coupled to the processing unit; and
an RF receiver coupled to the processing unit and the memory module, the RF receiver further comprising:
an input driver configured to receive a coarse signal, and configured to generate an input signal;
   a digital step attenuator (DSA) coupled to the input driver and configured to receive the input signal; and
   an analog to digital converter (ADC) coupled to the DSA, wherein the DSA further comprises:
      a sampling capacitor coupled to the ADC; and
      a time dependent resistor coupled to a source voltage and the sampling capacitor.

18. The computing device of claim 17, wherein a resistance of the time dependent resistor varies with time.

19. The computing device of claim 17, wherein a resistance of the time dependent resistor is an exponential function of time.

20. The computing device of claim 17, wherein the time dependent resistor comprises:
one or more secondary resistors coupled in parallel and coupled to a DSA output terminal; and
one or more secondary switches coupled to the one or more secondary resistors, each secondary switch is coupled between the source voltage and a secondary resistor on the one or more secondary resistors.

* * * * *